United States Patent [19]

Szczepanek

[11] Patent Number: 5,497,107
[45] Date of Patent: Mar. 5, 1996

[54] MULTIPLE, SELECTABLE PLAS HAVING SHARED INPUTS AND OUTPUTS

[75] Inventor: Andre Szczepanek, Brickhill, United Kingdom

[73] Assignee: Texas Instruments Incorporated, Dallas, Tex.

[21] Appl. No.: 61,643

[22] Filed: May 13, 1993

[51] Int. Cl.⁶ .......................... H03K 19/173; G06F 7/38
[52] U.S. Cl. ................................ 326/39; 326/41
[58] Field of Search ................. 307/465, 465.1; 326/39, 41

[56] References Cited

U.S. PATENT DOCUMENTS

| | | | |
|---|---|---|---|
| 4,609,986 | 9/1986 | Hartmann et al. | 307/465 |
| 4,758,746 | 7/1988 | Birkner et al. | 307/465 |
| 4,847,612 | 7/1989 | Kaplinsky | 307/465 |
| 5,023,606 | 6/1991 | Kaplinsky | 307/465 |
| 5,028,821 | 7/1991 | Kaplinsky | 307/465 |
| 5,220,215 | 6/1993 | Douglas et al. | 307/465 |

*Primary Examiner*—Edward P. Westin
*Assistant Examiner*—Richard Roseen
*Attorney, Agent, or Firm*—Robert D. Marshall; James C. Kesterson; Richard L. Donaldson

[57] ABSTRACT

Circuitry 10 is provided that contains two (or more) PLA matrix structures 12, 14 which share at least some outputs and are interconnected with a common output structure 18, individual input 30 and output 42, 62 structures, and an appropriate controller 28 for selecting which PLA matrix structure 12, 14 is to be employed. A common input structure 16 may be interconnected with the PLA matrix structures 12, 14 employed. The controller 28 may also be employed to power-down the PLA matrix structures not employed. The controller 28 may be static and select one matrix structure until reset, or dynamic and change as a function of some control signal.

21 Claims, 3 Drawing Sheets

MULTIPLE, SELECTABLE PLAS HAVING SHARED INPUTS AND OUTPUTS

TECHNICAL FIELD OF THE INVENTION

The present invention relates generally to programmable logic arrays (PLAs), and more particularly to multiple, selectable PLAs having shared inputs and outputs,

BACKGROUND OF THE INVENTION

A programmable logic array (PLA) is a compact way of implementing combinational logic functions (such as AND or OR logic) that involves a matrix of column and row lines in an input AND (or other logic function) plane and a matrix of row and column lines in an output OR (or other logic function) plane with the rows between the two planes appropriately coupled together. The AND plane generates specific logic combinations of the inputs and their complements. The outputs of the AND plane leave at right angles to its inputs and run horizontally to the inputs of the OR plane. The outputs of the OR plane then run vertically and may be stored in an output register. Various types of logic may be employed in each plane, other than AND or OR logic. In cases where it is necessary to know the outcome of the current data processing step before proceeding with the next step, some of the outputs are fed back as inputs. When outputs are fed back as feedback, such a sequential machine is known as a finite-state machine.

Complex synchronous sequential finite-state machines implemented on MOS integrated circuits are usually designed with programmable logic arrays, as this allows a modular and correctable design. A two clock phase logic system that evaluates once per clock cycle can be designed using a static NOR/NOR or AND/NOR programmable logic array. In this case the feedback lines are typically activated once per clock cycle through associated state variable latches that have two complementary outputs that form inputs to the NOR or AND plane. The inputs maybe applied continuously and are evaluated throughout the cycle except for the time necessary to set up the state variable latches. However, such systems can become unnecessarily complex in CMOS for static logic. Dynamic or clocked logic allows for creation of larger logic gates than may be employed in static logic. Complexity can be reduced by using a dynamic precharge/discharge PLA structure. However, such dynamic systems consume power even if the input signals remain the same.

PLAs are a convenient way to implement a specific type of communications protocol. For example, a PLA may be employed to implement aspects of a token ring or Ethernet network communications protocol for computers. Such aspects may be, for example, but not limited to, performing flaming functions; exemplary flaming functions might be delimiting flames, CRC generation and checking, and data serialization and deserialization.

Although communications protocols may be different, they often have a need for similar functions or functionality, and because of this may have some common input signals and/or output signals. One example of such similar functionality is performance of common flaming functions, as described earlier herein. It is possible to design and construct hardware that is capable of implementing one or more communications protocols that employs the same portion of the hardware for a given function or functionality, regardless of the protocol employed. This need to use one portion of the hardware to perform a given function, regardless of the protocol, may be caused by the desire to minimize chip size or the desire to use known working circuit designs to minimize design time. However, combining the PLAs of these known circuits into one PLA may not be possible for either size (too big) or operating (too slow) reasons. Thus, for such hardware there is a need for PLAs capable of implementing various types of communications protocols for both static and dynamic logic.

These and other disadvantages of the prior art are overcome by the present invention, however, and multiple, selectable PLAs having shared inputs and outputs are provided.

SUMMARY OF THE INVENTION

In a preferred embodiment of the present invention a circuit having two PLA matrix structures which share at least some outputs are interconnected with a common (or shared) output structure (for those outputs that are shared), individual input and output structures (for inputs and outputs that are not shared) for each respective PLA matrix structure, and an appropriate controller for selecting which PLA matrix structure is to be employed is provided. A common (or shared) input structure (for those inputs that are shared) may be interconnected with the two PLA matrix structures. The controller may also be employed to power-down the PLA matrix structure not employed. The controller may be static and select one matrix structure for use during a single duty cycle or until reset, or may be dynamic and change as a function of some control signal.

Preferably, any input and output structures include latches that are controlled by appropriate clock phases to allow for the use of dynamic matrix structures. That is, common input latches drive the common input lines for both matrix structures and common output latches receive the common outputs from both matrix structures.

Preferably, each PLA matrix structure is employed to implement the logic of a specific communications protocol. For example, one matrix structure may be for an Ethernet communications protocol and the other matrix structure may be for a token ring communications protocol. Embodiments of the present invention may also employ more than two PLA matrix structures.

It is a feature of the present invention to provide multiple, selectable PLAs having shared outputs.

It is a feature of the present invention to provide multiple, selectable PLAs having shared inputs.

These and other features and advantages of the present invention will become apparent from the following detailed description, wherein reference is made to the figures in the accompanying drawings.

BRIEF DESCRIPTION OF THE DRAWINGS

A more complete understanding of the present invention may be derived by referring to the detailed description and claims when considered in conjunction with the accompanying drawings in which like reference numbers indicate like features throughout the drawings, and wherein:

DETAILED DESCRIPTION

Figure 1:
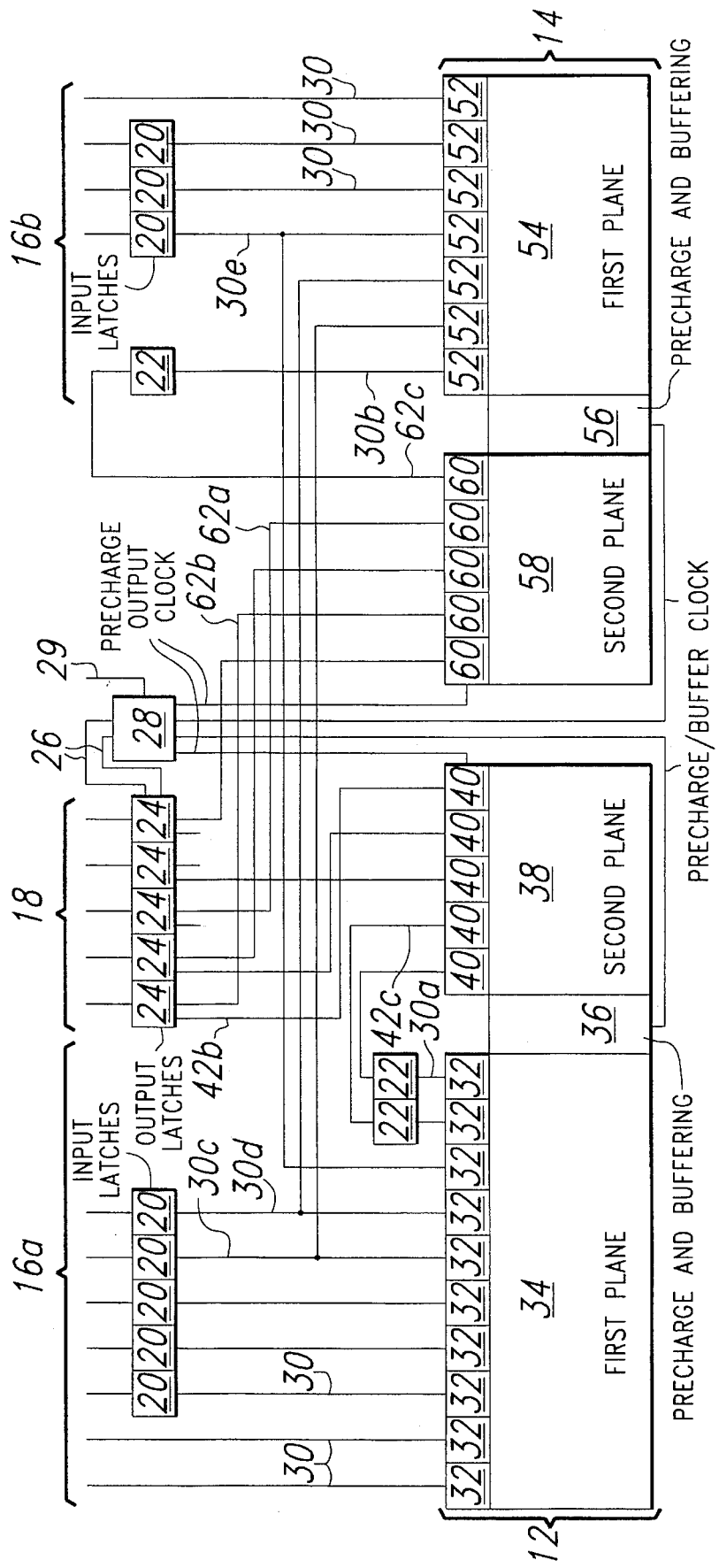
FIG. 1 depicts a simplified block diagram of a circuit employing two PLA matrix structures, having a shared output structure, constructed in accordance with the teachings of the present invention.

Referring now to FIG. 1, there may be seen an embodiment of the present invention that selectively employs one of two programmable logic array (PLA) matrix structures to implement one of two communications protocols. The finite state machine of FIG. 1 is depicted as having many common outputs and a few common inputs for the two protocols. This state machine uses not one PLA matrix structure for both protocols but instead has two PLA matrix structures of transistors with buffering, with one PLA for each of the two protocols. The circuit of FIG. 1 may be easily adapted to employ other protocols, such as, for example, but not limited to protocols for floating point calculations.

The use of two PLA matrix structures allows the matrix structure not in use to be powered down and avoid any unnecessary power consumption. In addition, by employing two matrix structures for the two protocols, generally the two matrix structures will be smaller than one large composite matrix structure capable of implementing the two protocols. Although timing considerations normally dictate the type of PLA selected, once selected, as the matrix size grows beyond a certain size additional design considerations require the addition of more circuit elements causing the circuit layout size to increase even more. Thus, the multiple, selectable PLA matrix structures of the present invention reduce power, layout size, and design time.

Continuing to refer to FIG. 1, there may be seen a simplified depiction of the preferred PLA circuit 10 of the present invention for implementing common flaming functions for Ethernet and token ring protocols. The PLA circuit 10 may be seen to consist of a first matrix structure 12, a second matrix structure 14, an input structure 16, and an output structure 18. In more detail, it may be seen that input structure 16 may employ input latches 20 or state variable latches 22. There is one input structure 16a for matrix 12 and a second input structure 16b for matrix 14. The output structure 18 employs output latches 24. Latches 24 are controlled by two selection lines 26 from controller 28, Controller 28 is in turn controlled by an appropriate signal on line 29.

As may be seen, matrix structure 12 is provided various inputs from the input structure 16a (which may include input buffers or latches 20) by input lines 30 which supply signals to buffers 32 associated with matrix structure 12. The buffers 32 supply the input signals and their complements (if needed) to the input columns of the first plane 34, which contains an array of columns and rows, and transistors (or gates) at appropriate intersections of those rows and columns. (For ease of depiction purposes the rows and columns, and transistors at their intersections of the matrix structure are not depicted in FIG. 1.) The output on the rows of the first plane 34 are supplied to a buffer and precharge circuitry block 36 which in turn supplies inputs to the rows of array or second plane 38. The output columns of second plane 38 are connected to output prechargers 40.

Output prechargers 40 via output lines 42 supply output signals to the various latches. Lines 42a and 42b are typical and supply output signals to output latches 24, while line 42c supplies an output signal to a state variable latch 22. This state variable latch 22 supplies feedback, via line 30a, to an input buffer 32 of the first plane 34 of matrix structure 12.

In a similar manner, input lines 30 of input structure 16b (which also include buffers or latches 20) supply input signals to input buffers 52 of the first plane 54 of matrix structure 14. The output rows of plane 54 connect to a buffer and precharge circuitry block 56, which in turn provides signals to the input rows of the second plane 58 of the matrix structure 14. The output signals from plane 58 are provided to output prechargers 60 which, via lines 62, provide output signals to the output structure 18, or the input structure 16b. Again a state variable latch 22 receives an output signal on line 62c and provides this feedback as an input on input line 30b.

Thus, it may be seen that output lines 62 and 42 supply their two output signals to each common output latch 24. Three output latches 24 depicted in FIG. 1 have only one output signal from either matrix 12, 14 as an input, and have a short unconnected line as their other input which is appropriately provided with a null signal (not depicted). Selection lines 26 determine whether the output signal on line 42 or line 62 will be stored in latch 24. Selection lines 26 may be from an appropriate controller 28. Although two lines 26 are depicted, the output latches 24 may also be appropriately controlled by a single selection or control line 26. Controller 28 may also perform a power function as described herein, but is employed to perform a selection function and a sampling at the correct time function.

As may also be seen from FIG. 1, some input lines 30c, 30d of input structure 16a supply inputs to matrix structure 14, as well as matrix structure 12. Similarly, input line 30e supplies inputs to both matrix structures 12, 14. For inputs that are common to both matrix structures the use of one input buffer or latch 20 for both matrix structures minimizes the total number of latches and reduces layout size and power requirements. In a similar manner, (although not depicted) common state variable latches 22 may be shared by both matrix structures 12, 14. For such a common state variable latch the outputs from the matrix structures may be individually supplied to latch 22 (similar to output latch 24) and the appropriate output selected by controller 28, or they may be collectively supplied to latch 22 as a single input.

The PLA matrix structures of FIG. 1 are not identical because they accomplish different logic. For example, one PLA matrix structure 12 may be for an Ethernet protocol and the other PLA matrix structure 14 for a token ring protocol. The output latches 24 are dual input rather than single input. Two sets of input column buffers 32, 52 are provided and may be fed from a common input latch 20 for both of the PLAs matrix structures 12, 14.

In FIG. 1, each PLA matrix structure 12, 14 preferably employs NOR/NOR logic and has two dynamic precharge-discharge arrays of transistors (or gates) that take data or signals from a set of input latches 20, combines them in appropriate NOR gates, buffers the result, and provides the resulting signals to a set of output latches 24. Each NOR element employs transistors in parallel to discharge a precharged line. In this structure, the output latches 24 have two inputs, one from each of the two matrix structures 12, 14 and a control signal 26 from an appropriate controller 28 which selects which one of the two inputs 42, 62 becomes the final output 18 to any external circuitry.

The details of the first planes 34, 54, second planes 38, 58, buffers 32, 52, precharge and buffering circuitry blocks 36, 56, and output prechargers 40, 60 of a given matrix structure 12, 14 for a PLA have not been described in detail as they are believed to be well known in the art. The logic operations that may be implemented in each plane may be AND, NAND, OR, or NOR as determined by the requirements of the circuitry the PLA circuit supports. Further, each plane may have any number of inputs and outputs. For static logic, increasing the number of inputs beyond a certain number requires additional circuit elements and additional circuit complexity.

The same input latches 20 may be used to drive a selected input for both the first and second matrix structure. Although not depicted in FIG. 1, there may be one block of input latches 20 for common inputs, in addition to the one block of output latches 24 for the common outputs of the two matrix structures. A few extra input and/or output latches or structures may be individually connected to each matrix structure. State variable latches 22 may also be shared or individual for each matrix structure.

As may be seen from FIG. 1, the common output latches 24 are in the middle, with state variable latches 22, input latches 20, and PLA matrix structures 12, 14 positioned symmetrically on either side in two groups. Thus, FIG. 1 is a state machine having two PLA matrix structures, with each matrix structure performing preselected logic operations, an output structure connected to the matrix structures, and a controller connected to the output structure for selecting which matrix structure provides outputs for the state machine.

Depending on the operational mode of FIG. 1, only one of the two (or more) PLA matrix structures 12, 14 is used. Further, and advantageously, the PLA matrix structure(s) that is(are) not used is(are) powered down, thereby saving power. For example, the circuit 10 does not charge or discharge the lines of the PLA matrix structure 12 or 14 which is not in use. This power control function is an additional function that controller 28 may be employed to perform, or alternatively a mode selection signal may be so employed. This may be easily accomplished by having the clocks for the buffer and precharge circuitry blocks 36, 56 and output prechargers 40, 60 of the two matrix structures 12, 14 appropriately supplied by the controller 28.

Thus, it may be seen that the present invention provides a preferably synchronous, finite state machine, having a first plane of logic elements for performing a first preselected type of logic operation having a first plurality of input column lines, a second plurality of row lines interconnectable with said first plurality of column lines, and a third plurality of switches interconnected between selected ones of said second plurality of row and first plurality of column lines and wherein each switch is operable in response to a voltage signal on an associated column line, a second plane of logic elements for performing a second preselected type of logic operation having a second plurality of row lines connected to said second plurality of row lines of said first plane, a fourth plurality of output column lines interconnectable with said second plurality row lines, and a fifth plurality of switches interconnected between selected ones of said second plurality of row and fourth plurality of column lines and wherein each switch is operable in response to a voltage signal on an associated row line, a third plane of logic elements for performing a third preselected type of logic operation having a sixth plurality of input column lines, a seventh plurality of row lines interconnectable with said sixth plurality of column lines, and an eighth plurality of switches interconnected between selected ones of said seventh plurality of row and sixth plurality of column lines and wherein each switch is operable in response to a voltage signal on an associated column line, a fourth plane of logic elements for performing a fourth preselected type of logic operation having a seventh plurality of row lines connected to said seventh plurality of row lines of said third plane, a ninth plurality of output column lines interconnectable with said seventh plurality of row lines, and a tenth plurality of switches interconnected between selected ones of said seventh plurality of row and ninth plurality of column lines and wherein each switch is operable in response to a voltage signal on an associated row line, and output column coupling means for selectively coupling either said fourth or ninth plurality of output column lines to a twelfth plurality of state machine outputs. The state machine may also contain an appropriate controller that causes the output column coupling means to select appropriate output column lines as state machine outputs.

Figure 2:
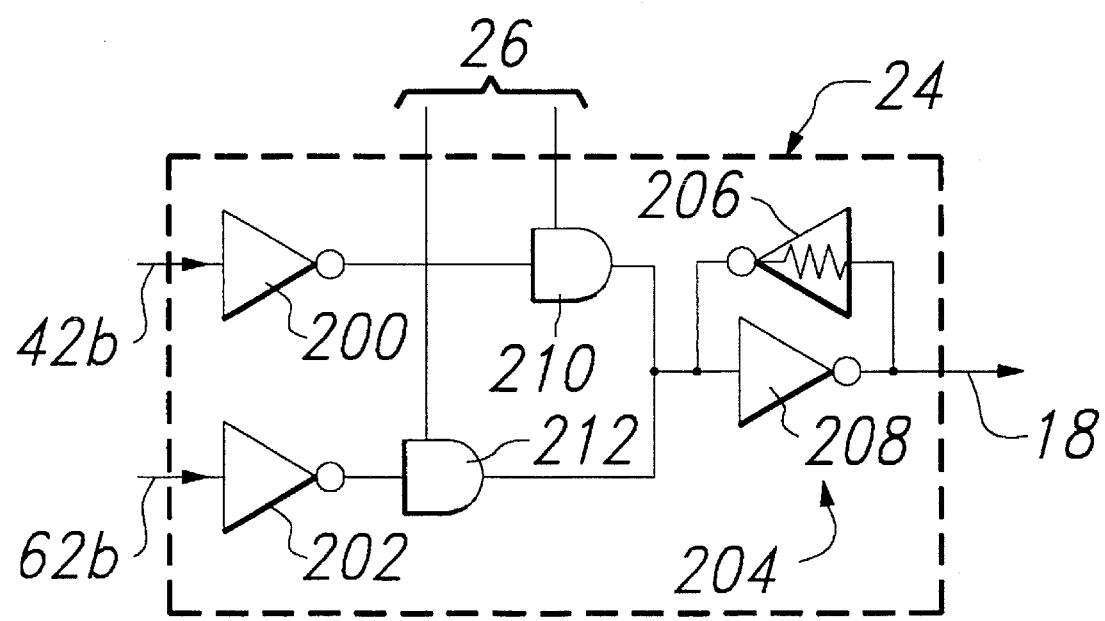
FIG. 2 depicts a simplified block diagram of an output latch employed in FIG. 1.

Referring now to FIG. 2, there may be seen a simplified block diagram of one of the output latches 24 of FIG. 1. More particularly, there may be seen two inverters 200, 202, one for each matrix 12, 14 output line 42b, 62b that serve as an input for a resistive latch 204. Again, if the output from a matrix 12 or 14 is not common (or shared) only one matrix signal (42b or 62b) is provided to the output latch 24 and the other signal is a "null" signal The resistive latch 204 is made up of two serially connected inverters, with one inverter 206 being a "resistive" inverter so its stored signal may be overcome by an input signal. The resistive inverter 206 feeds back its signal to the normal inverter 208. The output of the latch 204 is provided to subsequent circuitry as the output 18 of the state machine.

Two pass gates 210, 212, controlled by appropriate control signals on lines 26, from a controller 28, select which matrix output 42b, 62b is supplied to the latch 204 and the correct time for when it is to be sampled (i.e., the PLA's output 42b, 62b is sampled during the timing of an evaluation phase rather than a precharge phase). The output latches 24 may be any type of pseudodynamic latches, for example, but not limited to a latch with two input pass gates controlled by appropriate control signals, so that input is available from either of the two (or more) external sources (i.e. the two (or more) matrix structures). That is, an output latch 24 may be any type of latch having two (or more) latchable inputs that may select one of its inputs based upon some external control signal.

Figure 3:
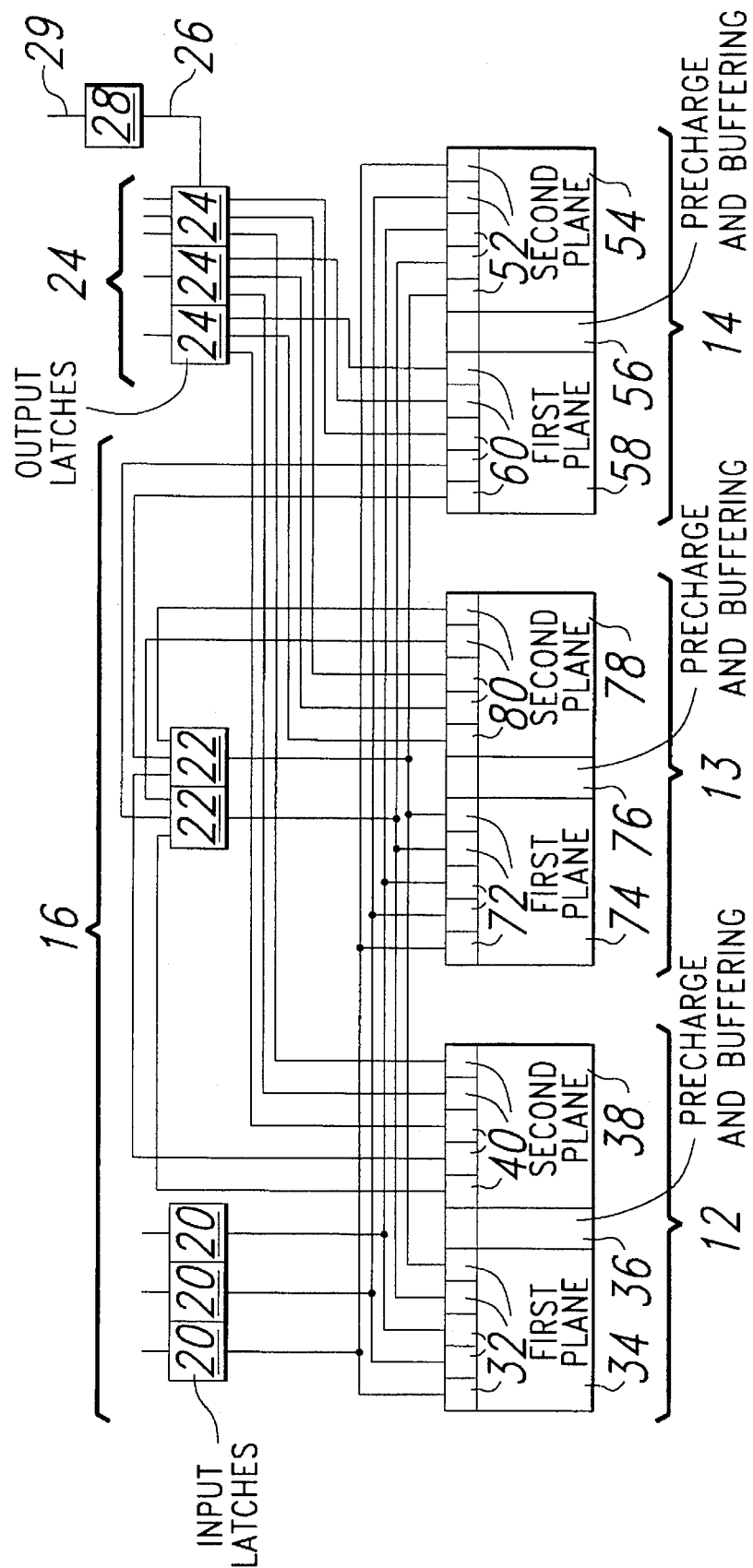
FIG. 3 depicts a simplified block diagram of a circuit employing three PLA matrix structures, having shared input and output structures, constructed in accordance with the teachings of the present invention.

Referring now to FIG. 3, there may be seen a simplified block diagram of a circuit that selectively employs one of three PLA matrix structures 12, 13, 14. The finite state machine of FIG. 3 again has a common input structure 16 (which includes state variable latches 22) and a common output structure 18 for each of the three matrix structures. In addition, an output of a matrix structure may serve both as common output and as feedback; that is, one of the outputs of an output latch 24 may be provided to a state variable latch 22 as its input, in addition to serving as an output.

Continuing to refer to FIG. 3, it may be seen that each matrix structure 12, 13, 14 has input buffers 32, 52 and 72, first planes 34, 54, 74, precharge and buffering circuitry blocks 36, 56, and 76, second planes 38, 58 and 78, and output prechargers 40, 60 and 80 similar to that illustrated in FIG. 1. Clearly, other circuit arrangements may be so employed for each matrix structure 12, 13, 14.

The input structure 16 employs input buffers or latches 20 to provide input signals to each of the matrix structures 12, 13, 14. A common set of state variable latches 22 are also depicted as part of the input structure 16. Although each state variable latch 22 is depicted in FIG. 3 as having an individual input from each of the three matrix structures 12, 13, 14 and providing one output to all three of the matrix structures 12, 13, 14, each state variable latch 22 may also have one or more inputs and one output. For the depicted three inputs case, the operation of latch 22 is similar in operation to an output latch 24 as described below. In addition, all PLA's might not use all the state variables and accordingly an output from such a PLA would not be connected as an input to a state variable latch 22; for this case, the unused input is not connected to a PLA output, but is instead provided an appropriate "null" or "one" signal.

As depicted in FIG. 3, the output structure 18 employs output latches 24 having an "input" from each of the three matrix structures 12, 13, 14. Each output latch 24 is controlled by a signal on line(s) 26 to select the appropriate input signal as its output. Again, this control signal is provided by an appropriate controller 28, which is in turn controlled by a signal on line 29. In a manner analogous to that of FIG. 1, each output latch 24 may have as few as one (or two) output signals from a matrix structure as its input(s) and the remaining input(s) are a null signal. For the circuit of FIG. 3, it is especially preferable that only the PLA matrix structure in use is powered up and the remaining matrix structures are not powered up. Again, the controller 28 may provide this powering up function, as well as any selection of the appropriate output for output latches 24 and state variable latches 22 (if necessary).

FIG. 3 depicts a totally common input and output structure. However, clearly, one or more of the three matrix structures may have individual inputs (including state variables) and/or outputs. Also, more than three such matrix structures may be so employed. Thus, it may be seen that the present invention provides a state machine having at least two PLA matrix structures, with each matrix structure performing preselected logic operations, an output structure connected to said matrix structures, and a controller connected to the output structure for selecting which matrix structure provides outputs for the state machine.

Although described for PLA matrix structures employing two logic planes, the present invention may also employ simpler single plane PLA matrix structures. The present invention may also employ static logic rather than dynamic logic, although dynamic logic is presently preferred.

Many other variations and modifications may be made in the techniques and apparatus hereinabove described, by those having expertise in this technology, without departing from the concepts of the present invention. Accordingly, it should be clearly understood that the methods and apparatus depicted in the accompanying drawings and referred to in the foregoing description are illustrative only and are not intended as limitations on the scope of the invention.

What is claimed is:

1. A state machine, comprising:
    at least two programmable logic array matrix structures, with each matrix structure having corresponding input terminals and output terminals and performing preselected logic operations;
    an output structure connected to said output terminals of said matrix structures; and
    a controller connected to said output structure for selecting said output terminals of one of said matrix structures to provide operational outputs for said state machine, said controller further connected to said matrix structures for selecting which matrix structure is provided power for its operation.

2. The state machine of claim 1, further comprising:
    at least two input structures, with each input structure connected to said input terminals of a corresponding one of said matrix structures.

3. The state machine of claim 1, wherein said at least two matrix structures are two matrix structures.

4. The state machine of claim 1, further comprising, at least One feedback latch having an input connected to an output terminal of at least one of said matrix structures and having an output connected to at least one input of said at least one Of said matrix structures, said feedback latch storing a signal Supplied to said input and supplying said stored signal at said output.

5. The state machine of claim 1, wherein said preselected logic operations each are individually selected from AND, OR, NAND, or NOR operations.

6. The state machine of claim 1, wherein all of said preselected logic operations are NOR operations.

7. The state machine of claim 1, wherein:
    said output structure includes a plurality of output latches, one output latch for each output of said state machine, each output latch having two input terminals connected to output terminals of respective ones of said two matrix structures, each output latch storing therein a signal from said one of said matrix structures selected to provide operational outputs for said state machine.

8. The state machine of claim 7, wherein:
    said output structure further includes at least one further output latch having one input terminal connected to an output terminal of a single one of said two matrix structures, each further output latch storing therein a signal from said one of said matrix structures for operational output for said state machine.

9. The state machine of claim 6, wherein:
    said controller selects which matrix structure is provided power for its operation by selective supply of clock signals.

10. A state machine, comprising:
    a first programmable logic array matrix structure having first input terminals and first output terminals, said first programmable logic array for performing at least one preselected logic operation;
    a second programmable logic array matrix structure having second input terminals and second output terminals, said a second programmable logic array for performing at least one preselected logic operation;
    a first input structure connected to said first input terminals of said first matrix structure for supplying first input signals thereto;
    a second input structure connected to said second input terminals of said second matrix structure for supplying second input signals thereto;
    an output structure connected to said output terminals of said first and second matrix structures; and
    a controller connected to said output structure for selecting which of said first and second matrix structures provides operational outputs for said state machine, said controller further connected to said matrix structures for selecting which matrix structure is provided power for its operation.

11. The state machine of claim 10, wherein a portion of said first input structure is connected to said second input terminals of said second matrix structure for supplying at least one input signal thereto.

12. The state machine of claim 10, wherein a portion of said second input structure is connected to said first input terminal of said first matrix structure for supplying at least one input signal thereto.

13. The state machine of claim 10, further comprising, at least one feedback latch having an input connected to an output terminal of said at least one of said matrix structures and having an output connected to at least one input Of said at least one of said matrix structures, said feedback latch storing signal supplied to said input and supplying said stored signal at said output.

14. The state machine of claim 10, wherein:

said output structure includes a plurality of output latches, one output latch for each output of said state machine, each output latch having two input terminals connected to output terminals of respective ones of said two matrix structures, each output latch storing therein a signal from said one of said matrix structures selected to provide operational outputs for said state machine.

15. The state machine of claim 14, wherein:

said output structure further includes at least one further output latch having one input terminal connected to an output terminal of a single one of said two matrix structures, each further output latch storing therein a signal from said one of said matrix structures for operational output for said state machine.

16. The state machine of claim 15, wherein:

said controller selects which matrix structure is provided power for its operation by selective supply of clock signals.

17. A programmable logic array circuit, comprising:

a first matrix structure having a plurality of first input terminals and a plurality of second output terminals, a second matrix structure having a plurality of second input terminals and a plurality of second output terminals and wherein a portion of the signals on said plurality of second output terminals are common with signals on said plurality of first output terminals of said first matrix structure, an output structure connected to said first output terminals and said second output terminals corresponding to said common outputs of said first and second matrix structures, and a controller connected to said matrix structures for selecting which matrix structure is provided power for its operation.

18. The circuit of claim 17 wherein said controller is further connected to said output structure for causing said output structure to select for output at said common outputs one of either said first output terminals of said first matrix structure and said second output terminals of said second matrix structure.

19. The circuit of claim 17, further comprising:

a third matrix structure having a plurality of third input terminals and a plurality of third output terminals and wherein said output structure is connected to common outputs of all three matrix structures.

20. The programmable logic array circuit of claim 18, wherein:

said output structure includes a plurality of output latches, one output latch for each output of said state machine, each output latch having two input terminals connected to output terminals of respective ones of said two matrix structures, each output latch storing therein a signal from said one of said matrix structures selected to provide operational outputs for said state machine.

21. The programmable logic array circuit of claim 18, wherein:

said controller selects which matrix structure is provided power for its operation by selective supply of clock signals.

* * * * *